(12) United States Patent
Huang et al.

(10) Patent No.: US 7,645,651 B2
(45) Date of Patent: Jan. 12, 2010

(54) LDMOS WITH CHANNEL STRESS

(75) Inventors: Xiaoqiu Huang, Austin, TX (US);
Veeraraghavan Dhandapani, Round Rock, TX (US); Bich-Yen Nguyen, Austin, TX (US); Amanda M. Kroll, Austin, TX (US); Daniel T. Pham, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 214 days.

(21) Appl. No.: 11/951,702

(22) Filed: Dec. 6, 2007

(65) Prior Publication Data

US 2009/0146180 A1 Jun. 11, 2009

(51) Int. Cl.
*H01L 21/00* (2006.01)
*H01L 21/84* (2006.01)
*H01L 21/337* (2006.01)
*H01L 21/8238* (2006.01)
*H01L 21/8236* (2006.01)
*H01L 21/336* (2006.01)

(52) U.S. Cl. ............... 438/163; 438/195; 438/231; 438/276; 438/305; 257/E21.435; 257/E21.437

(58) Field of Classification Search ............... 438/154, 438/163, 181, 184, 185, 195, 199, 231, 232, 438/276, 289, 301, 302, 305, 306; 257/E21.435, 257/E21.436, E21.437

See application file for complete search history.

(56) References Cited

U.S. PATENT DOCUMENTS

| 6,709,926 B2 * | 3/2004 | Chidambarrao et al. ..... 438/258 |
| 7,078,285 B1 * | 7/2006 | Suenaga .................... 438/199 |
| 7,176,522 B2 * | 2/2007 | Cheng et al. ................ 257/338 |
| 7,528,029 B2 * | 5/2009 | Grudowski et al. ......... 438/199 |
| 7,579,262 B2 * | 8/2009 | Hoentschel et al. ......... 438/478 |
| 2006/0261416 A1 * | 11/2006 | Hachimine .................. 257/369 |

OTHER PUBLICATIONS

Kondo et al; "High Performance RF Power LDMOSFETs for Cellular Handsets Formed in Thick-Strained-Si/Relaxed-SiGe Structure" Electron Devices Meeting, 2005. IEDM Technical Digest. IEEE International Dec. 5-7, 2005 pp. 365-368.

Sugii et al; "Strained-silicon MOSFETs of low leakage current and high breakdown voltage for analog applications" VLSI Technology, 2005. Digest of Technical Papers. 2005 Symposium on Jun. 14-16, 2005 pp. 54-55.

* cited by examiner

*Primary Examiner*—Alexander G Ghyka
*Assistant Examiner*—Seahvosh J Nikmanesh
(74) *Attorney, Agent, or Firm*—James L. Clingan, Jr.; Michael J. Balconi-Lamica

(57) ABSTRACT

A method of forming a metal oxide semiconductor (MOS) device comprises defining an active area in an unstrained semiconductor layer structure, depositing a hard mask overlying the active area and a region outside of the active area, patterning the hard mask to expose the active area, selectively growing a strained semiconductor layer overlying the exposed active area, and forming a remainder of the MOS device. The active area includes a first doped region of first conductivity type and a second doped region of second conductivity type. The strained semiconductor layer provides a biaxially strained channel for the MOS device. During a portion of forming the remainder of the MOS device, dopant of the first conductivity type of the first doped region of the active area and dopant of the second conductivity type of the second doped region of the active area diffuses into overlying portions of the strained semiconductor layer to create a correspondingly doped strained semiconductor layer, thereby providing corresponding doping for the biaxially strained channel.

19 Claims, 4 Drawing Sheets

LDMOS WITH CHANNEL STRESS

BACKGROUND

1. Field

This disclosure relates generally to LDMOS transistors, and more specifically, to LDMOS transistors with stress in the channel.

2. Related Art

In laterally diffused metal oxide semiconductor (LDMOS) transistors, there is a tradeoff between resistivity, commonly known as Rdson, and high voltage breakdown. Breakdown can be increased by reducing the doping level of the high voltage N well that is for the drift region. This, however, causes the Rdson to increase. An approach for reducing Rdson that has been proposed is to introduce stress into the channel by forming a silicon layer over a thick epitaxial layer of silicon germanium (SiGe). One difficulty with this approach is that while depositing the underlying SiGe layer sufficiently thick for the SiGe layer to be relaxed, a high density of threading dislocations occurs. Some of these threading dislocations continue to grow into subsequently grown silicon causing defects in the silicon that lead to leakage and other potential problems. Further, other device types may be on the same integrated circuit as the LDMOS device and the grown SiGe layer may not be desirable for those other circuit types such as MOS transistors designed for logic operations and MOS transistors designed for analog operations. Also a thick SiGe layer is relatively expensive because of the time required to perform the growth.

Thus, there is a need for improving the tradeoff between Rdson and breakdown voltage in an LDMOS transistor while avoiding or reducing the impact of one or more of the problems described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, stress is present in the channel of an LDMOS transistor by growing a semiconductor layer over a monocrystalline silicon layer that is useful in forming wells for the LDMOS device as well as potentially other transistor types such as MOS transistors for logic and/or analog functions. The regions where the stressed semiconductor layer is to be formed are exposed while the other areas are masked off. The stressed layer is thus grown only where it is needed and is thin so that topography issues relative to the other transistor types are minimal. The LDMOS transistors are then formed using the stressed layer as the channel. Thus, the channel has enhanced mobility which reduces Rdson while not adversely impacting the breakdown voltage. This is better understood by reference to the following description and the drawings.

Figure 1:
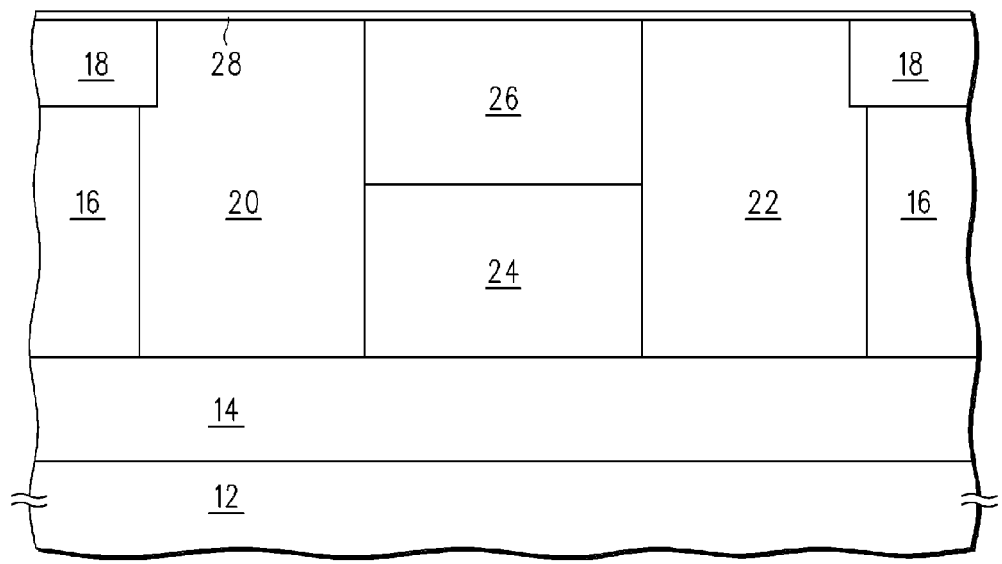
FIG. 1 is a cross section of a semiconductor device at a stage in processing according to an embodiment of the invention.

Shown in FIG. 1 is a semiconductor device 10 comprising a semiconductor substrate 12, a buried layer 14 that may be formed over substrate 12 by epitaxial growth and doped, a region 16 that may be formed by continuing epitaxial growth from buried layer 14 and doped, trench isolation 18 for defining an active area for forming an LDMOS transistor, a well region 20 in the active area adjacent to region 16 and over buried layer 14, a well region 22 on the other side of the active region and adjacent to region 16 and over buried layer 14, a doped region 24 between well regions 20 and 22 and over buried layer 14, a high voltage well 26 between well regions 20 and 22 and over doped region 24, and an oxide layer 28. Well regions 20, 22, and 26 and doped region 24 may be formed by epitaxial growth of region 16 and subsequently doped. Oxide layer 28 is for preventing pitting during implants that dope well regions 20, 22, and 26 and regions 16 and 24. For the case of forming an N channel laterally diffused metal oxide semiconductor (LDMOS) transistor, buried layer 14 is n-type, regions 16 are p-type, wells 20 and 22 are p-type. The p-type doping of region 16 may occur as in-situ doping during epitaxial growth. Wells 20 and 22 are further doped with p-type material so that wells 20 and 22 are more heavily doped than region 16. The doping of wells 20 and 22 may be by implanting boron. Doped region 24 is also p-type that may be of a concentration lower than that of wells 20 and 22. High voltage well 26 is n-type of a relatively low concentration. For the case of forming a P channel LDMOS transistor, the conductivity types are reversed. Thus, wells 20 and 22 and region 24 would be n-type, and buried layer 14 and high voltage well 26 would be p-type. Typically reference will be made to the various elements in the form for making an N channel LDMOS transistor because that is the most common type. Well regions 20, 22, and 26, regions 16 and 24, and buried layer 14 are all monocrystalline regions that have been doped and otherwise are just silicon. There may be some trace amounts of other elements but would be less than one hundredth of one percent. Thus just silicon in this case means a material that is at least 99.99 atomic percent silicon.

Figure 2:
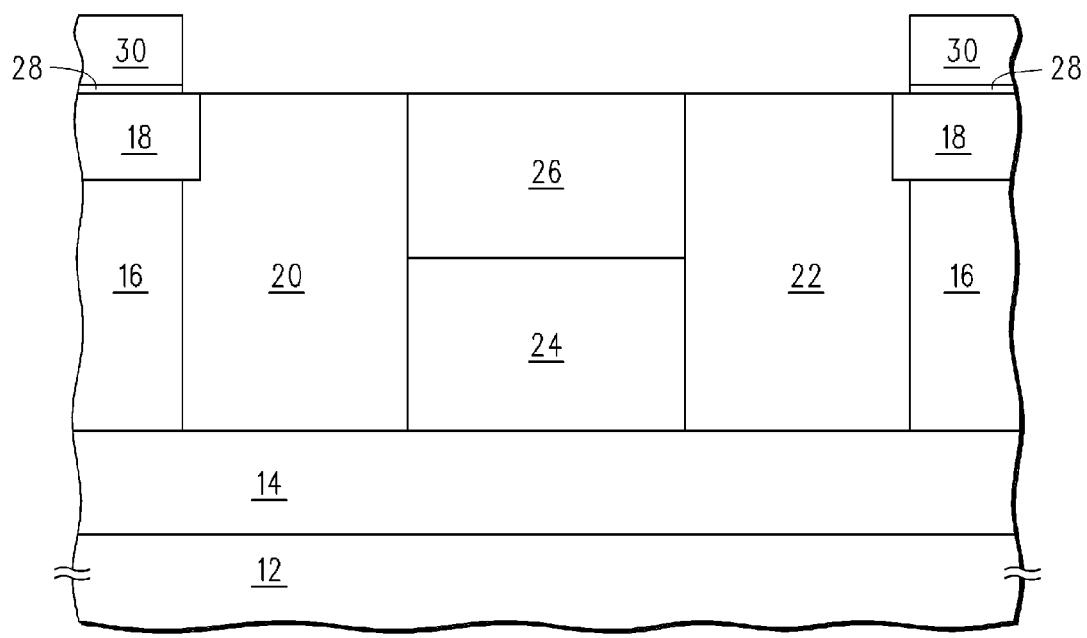
FIG. 2 is a cross section of the semiconductor device of FIG. 1 at a subsequent stage in processing.

Shown in FIG. 2 is semiconductor device 10 after forming a hard mask 30 that is patterned to leave the top surfaces of wells 20, 22, and 26 exposed. Hard mask 30 may be an undoped oxide such as CVD oxide. Oxide layer 28 is patterned the same as hard mask 30.

Figure 3:
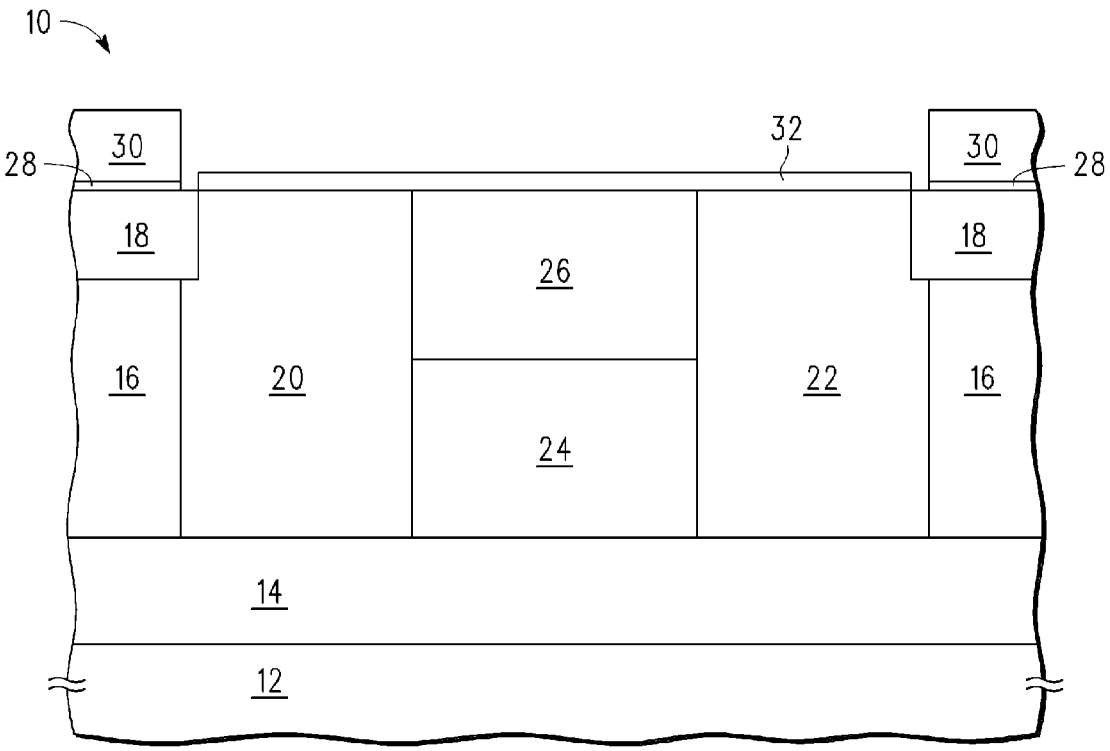
FIG. 3 is a cross section of the semiconductor device of FIG. 2 at a subsequent stage in processing.

Shown in FIG. 3 is semiconductor device 10 after epitaxially growing a semiconductor layer 32 that is silicon and another material so that the lattice constant is different from that of just silicon. For an N type LDMOS transistor, the other material is preferably carbon which results in semiconductor layer 32 being under tensile stress. For a P type LDMOS transistor, the other material is preferably germanium which results in semiconductor layer being under compressive stress. In the case of carbon, the percentage of carbon may be 0.1 to 2.0 is atomic percent. In the case of germanium, the percentage of germanium may be 10 to 50 atomic percent. Semiconductor layer 32 is preferably relatively thin. For example for a technology in which the minimum gate length is 0.25 micron, the thickness of semiconductor 32 may 100-300 Angstroms so that threading dislocations do not necessarily occur. The epitaxial growth of semiconductor layer 32 is selective to those active areas that have exposed silicon.

Hard mask 30 extends to cover active areas of transistors for which semiconductor layer 32 is not desired. Thus, transistors on the same integrated circuit but for use in logic and analog operations are easily excluded from receiving this epitaxial growth. Also, since semiconductor layer 32 is relatively thin, there is little additional added height to the features that are formed over semiconductor layer 32. Thus, there is little adverse impact to topography. If both P and N type LDMOS transistors are to have a stressed semiconductor layer such as semiconductor layer 32, then this structure shown in FIG. 3 would be masked while the analogous stressed semiconductor layer would be formed over the other type of LDMOS transistors.

Figure 4:
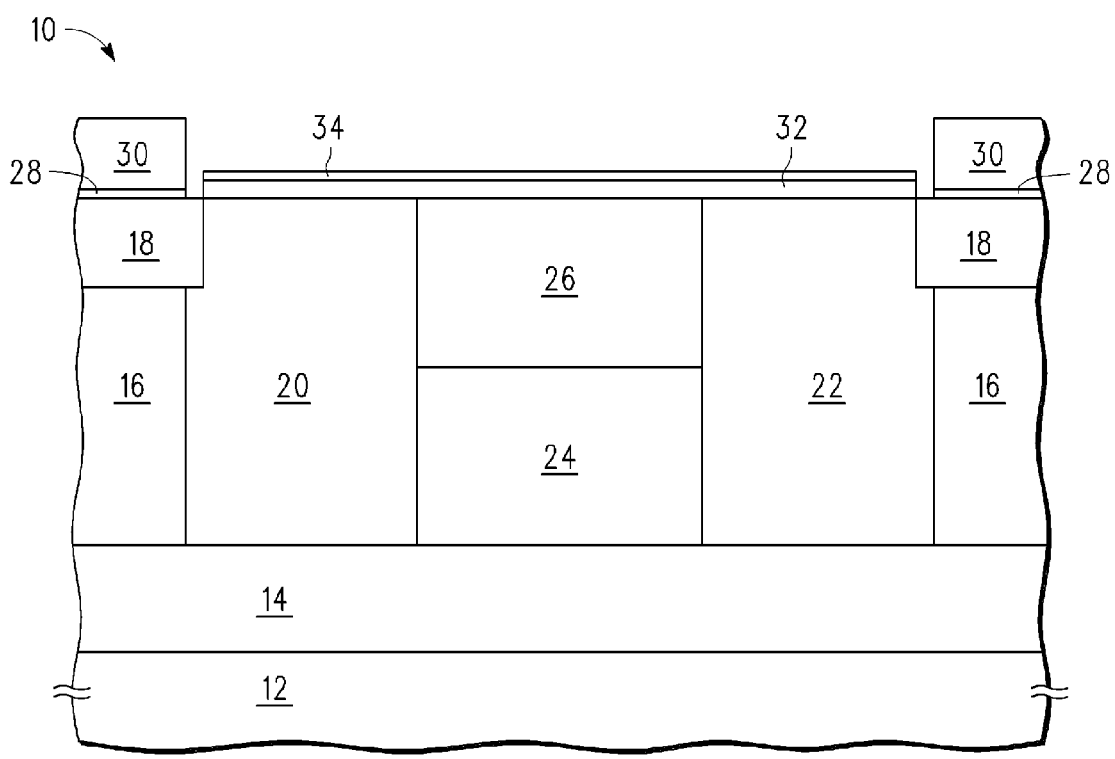
FIG. 4 is a cross section of the semiconductor device of FIG. 3 at a subsequent stage in processing.

Shown in FIG. 4 is semiconductor device 10 after forming a silicon layer 34 over semiconductor layer 32. Silicon layer 34 is preferably just silicon that is monocrystalline and that may be grown epitaxially. Silicon layer 34 may be even thinner than semiconductor layer 32 and may be 100 Angstroms. Silicon layer 34 is beneficial for subsequent formation of a gate dielectric so the thickness chosen is intended for the resulting desired thickness of the gate dielectric. Silicon layer 34 may also be considered a capping layer.

Figure 5:
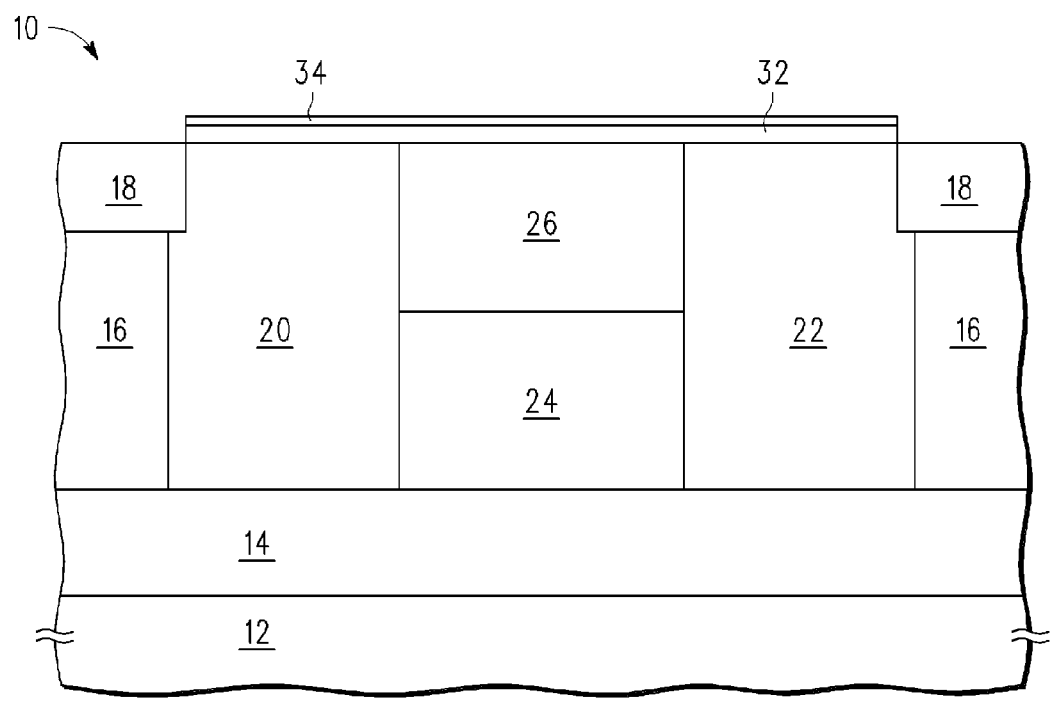
FIG. 5 is a cross section of the semiconductor device of FIG. 4 at a subsequent stage in processing.

Shown in FIG. 5 is semiconductor device 10 after removing hard mask 30. This may expose active areas of the other transistor types in other locations of the integrated circuit in preparation for gate dielectric formation by thermal oxidation.

Figure 6:
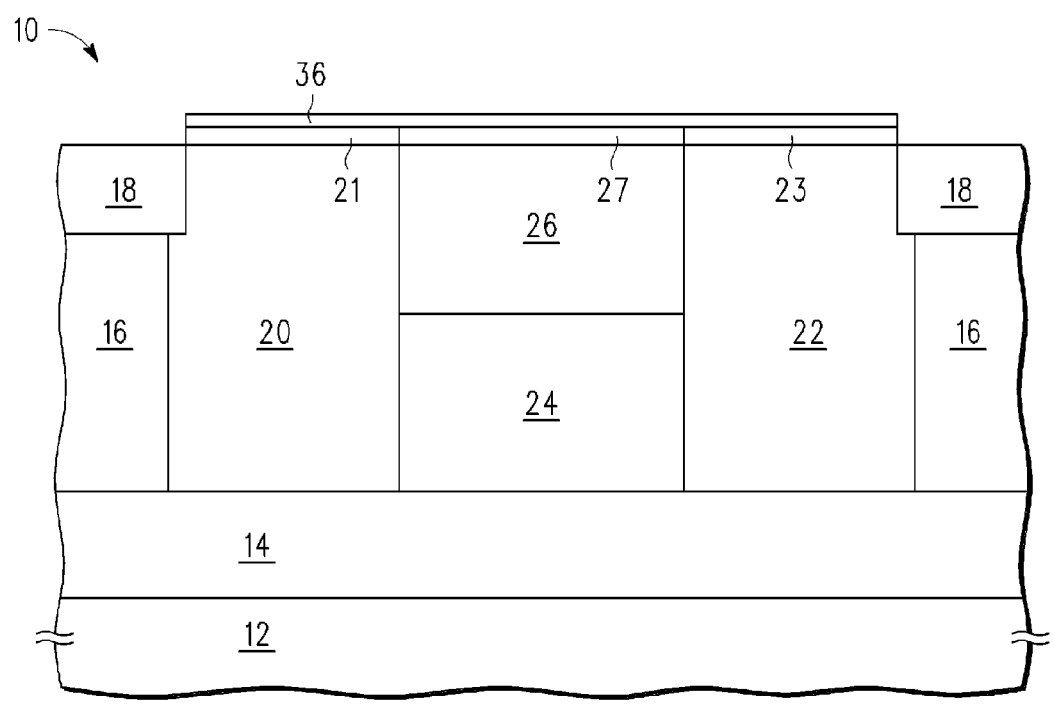
FIG. 6 is a cross section of the semiconductor device of FIG. 5 at a subsequent stage in processing.

Shown in FIG. 6 is semiconductor device 10 after oxidizing layer 32 to form oxide layer 36. Because this is a high temperature process, there is diffusion from wells 20, 22, and 26 into semiconductor layer 32. For the case of a N type LDMOS transistor, the result is a p-type region 21 over well 20, an n-type region 27 over well 26, and a p-type region 23 over well 22. Oxide layer 36 is thus an oxide of the type commonly used for gate dielectrics.

Figure 7:
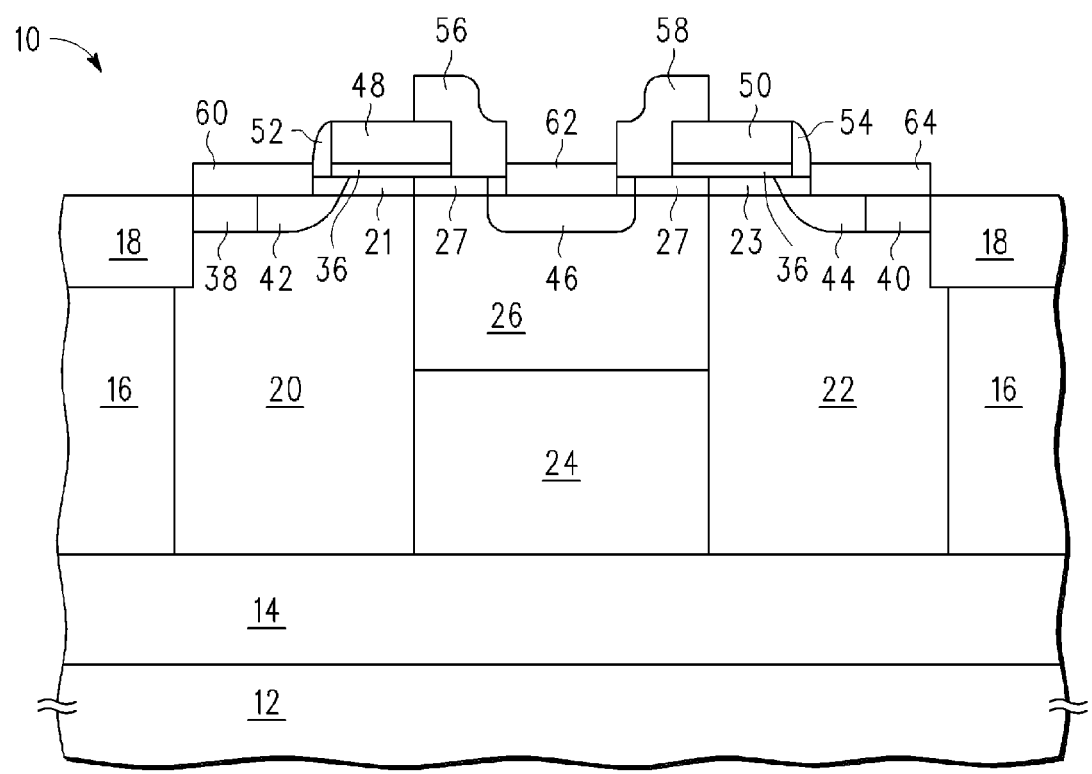
FIG. 7 is a cross section of the semiconductor device of FIG. 6 at a subsequent stage in processing.

Shown in FIG. 7 is semiconductor device 10 after completing formation of an LDMOS transistor using oxide layer 36 as the gate dielectric. As shown and for an N type LDMOS transistor, the LDMOS transistor has a heavily doped P region 38 in well 20 for making contact to well 20, a heavily doped P region 40 in well 22 for making contact to well 22, a source region 42 on n-type adjacent to P region 38 in well 20, a source region 44 of n-type adjacent to P region 40 in well 22, a drain region. 46 of n-type in well 26, a gate 48 over oxide layer 36 and between source 42 and drain 46, a gate 50 over oxide layer 36 and between source 44 and drain 46, a sidewall spacer 52 on a sidewall of gate 48 on the side away from drain 46, a sidewall of spacer 54 on a sidewall of gate 50 on the side away from drain 46, a silicide block 56 along the side of gate 48 away from sidewall spacer 52, a silicide block 58 on a sidewall of gate 50 on a side away from sidewall spacer 54, a silicide layer 60 on P region 38 and source 42, a silicide layer 62 on drain 46, and a silicide layer 64 on P region 40 and source region 44. The result is a channel between source 42 and drain 46 is in P region 21 and N region 27 both of which are in tensile stress for an N type LDMOS transistor. Similarly, the result is also a channel between source 44 and drain 46 is in P region 23 and N region 27 both of which are in tensile stress for an N type LDMOS transistor. Thus, the channels are under uniaxial tensile stress.

The resulting LDMOS transistor of FIG. 7 thus has enhanced mobility so that Rdson can be reduced for the same doping concentration of well 26 and thus the same breakdown voltage. Because the channel is in a thin stressed layer grown from a layer of just silicon, problems with threading dislocations are alleviated. Because the added stressed layer is thin there is little topography impact. Because the active areas that are not receiving the stressed layer are masked off, other transistor types are not adversely impacted by the process of forming the added stressed layer.

By now it should be understood that there has been provided a method of forming a metal oxide semiconductor (MOS) device. The method includes defining an active area in an unstrained semiconductor layer structure, the active area including at least a first doped region of a first conductivity type and a second doped region of a second conductivity type. The method further includes depositing a hard mask overlying the active area and a region outside of the active area. The method further includes patterning the hard mask to expose the active area. The method further includes selectively growing a strained semiconductor layer overlying the exposed active area, the strained semiconductor layer thereby providing a biaxially strained channel for the MOS device. The method further includes forming a remainder of the MOS device including forming at least a gate dielectric, gate electrodes, source and drain implants, and sidewall spacers, wherein during a portion of forming the remainder of the MOS device, dopant of the first conductivity type of the first doped region of the active area and dopant of the second conductivity type of the second doped region of the active area diffuses into overlying portions of the strained semiconductor layer to create a correspondingly doped strained semiconductor layer, the correspondingly doped strained semiconductor layer thereby providing corresponding doping for the biaxially strained channel of the MOS device. The method may be further characterized by the MOS device comprising a laterally diffused metal oxide semiconductor (LDMOS) transistor. The method may be further characterized by the hard mask comprising an undoped oxide. The method may be further characterized by the undoped oxide comprising a CVD oxide having a thickness on the order of 400 angstroms. The method may be further characterized by a portion of the hard mask overlying the region outside of the active area provides protection to corresponding underlying portions of the semiconductor layer structure from subsequent MOS device processing. The method may be further characterized by the strained semiconductor layer being undoped. The method may be further characterized by the strained semiconductor layer having a thickness on the order of 100 to 300 angstroms. The method may be further characterized by the strained semiconductor layer includes at least one selected from the group consisting of a SiC strained layer and a SiGe strained layer. The method may be further characterized by the SiC strained layer comprising tensile strained SiC for an n-type MOS device. The method may be further characterized by the SiC strained layer comprising on the order of one-tenth to two atomic percent (0.1 to 2 at. %) carbon. The method may be further characterized by the n-type MOS device comprising an n-type LDMOS device. The method may be further characterized by the SiGe strained layer comprising compressive strained SiGe for a p-type MOS device. The method may be further characterized by the p-type MOS device comprising a p-type LDMOS device. The method may be further characterized by the SiGe strained layer comprising on the order of ten to fifty atomic percent (10 to 50 at. %) germanium. The method may be further characterized by, prior to forming the remainder of the MOS device, capping the strained semiconductor layer with a selectively grown semiconductor material. The method may be further characterized by the selectively grown semiconductor material providing a consumable layer for consumption during the forming of at least one gate dielectric. The method may be further characterized by the selectively grown semiconductor material comprising epitaxial silicon. The method may be further characterized by the selectively grown semiconductor material having a thickness on the order of 50 to 150 angstroms.

Also described is a method of forming a metal oxide semiconductor (MOS) device. The method includes defining an active area in an unstrained semiconductor layer structure, the active area including at least a first doped region of a first conductivity type and a second doped region of a second conductivity type. The method further includes depositing a hard mask overlying the active area and a region outside of the active area. The method further includes patterning the hard mask to expose the active area. The method further includes selectively growing a strained semiconductor layer overlying the exposed active area, the strained semiconductor layer thereby providing a biaxially strained channel for the MOS device, wherein the strained semiconductor layer includes at least one selected from the group consisting of a SiC strained layer and a SiGe strained layer, further wherein the SiC strained layer comprises on the order of one-tenth to two atomic percent (0.1 to 2 at. %) carbon, further wherein the SiGe strained layer comprises on the order of ten to fifty atomic percent (10 to 50 at. %) germanium. The method further includes capping the strained semiconductor layer with a selectively grown semiconductor material. The method further includes forming a remainder of the MOS device including forming at least a gate dielectric, gate electrodes, source and drain implants, and sidewall spacers, wherein during a portion of forming the remainder of the MOS device, dopant of the first conductivity type of the first doped region of the active area and dopant of the second conductivity type of the second doped region of the active area diffuses into overlying portions of the strained semiconductor layer to create a correspondingly doped strained semiconductor layer, the correspondingly doped strained semiconductor layer thereby providing corresponding doping for the biaxially strained channel of the MOS device.

Further described is a metal oxide semiconductor (MOS) device. The MOS device includes an active area defined in an unstrained semiconductor layer structure, the active area including at least a first doped region of a first conductivity type and a second doped region of a second conductivity type. The MOS device further includes a strained semiconductor layer overlying the active area, the strained semiconductor layer providing a biaxially strained channel for the MOS device. The MOS device further includes a remainder of the MOS device including at least a gate dielectric, gate electrodes, source and drain implants, and sidewall spacers, wherein portions of the strained semiconductor layer overlying (i) the first doped region of the active area and (ii) the second doped region of the active area include correspondingly doped regions of the strained semiconductor layer diffused with dopant of the first conductivity type and dopant of the second conductivity type, respectively, the correspondingly doped strained semiconductor layer thereby providing corresponding doping for the biaxially strained channel of the MOS device.

Although the invention is described herein with reference to specific embodiments, various modifications and changes can be made without departing from the scope of the present invention as set forth in the claims below. For example and as pointed out previously, both N and P type LDMOS transistors can be made by reversing the conductivity types and using the appropriate stressed semiconductor layer. Further a benefit is present for using two sources which in a sense results in two LDMOS transistors, but there may be situations in which it may be advantageous to use just one drain. Also, although the formation of semiconductor layer 34 is useful in forming a gate oxide, it may also be useful to use a different type of gate dielectric, such as a material with a dielectric constant greater than that of silicon dioxide, which is one example in which it may not be beneficial to form silicon layer 34. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a metal oxide semiconductor (MOS) device comprising:
   defining an active area in an unstrained semiconductor layer structure, the active area including at least a first doped region of a first conductivity type and a second doped region of a second conductivity type;
   depositing a hard mask overlying the active area and a region outside of the active area;
   patterning the hard mask to expose the active area;
   selectively growing a strained semiconductor layer overlying the exposed active area, the strained semiconductor layer thereby providing a biaxially strained channel for the MOS device; and
   forming a remainder of the MOS device including forming at least a gate dielectric, gate electrodes, source and drain implants, and sidewall spacers, wherein during a portion of forming the remainder of the MOS device, dopant of the first conductivity type of the first doped region of the active area and dopant of the second conductivity type of the second doped region of the active area diffuses into overlying portions of the strained semiconductor layer to create a correspondingly doped strained semiconductor layer, the correspondingly doped strained semiconductor layer thereby providing corresponding doping for the biaxially strained channel of the MOS device.

2. The method of claim 1, wherein the MOS device comprises a laterally diffused metal oxide semiconductor (LDMOS) transistor.

3. The method of claim 1, wherein the hard mask comprises an undoped oxide.

4. The method of claim 3, further wherein the undoped oxide comprises a CVD oxide having a thickness on the order of 400 angstroms.

5. The method of claim 1, wherein a portion of the hard mask overlying the region outside of the active area provides protection to corresponding underlying portions of the semiconductor layer structure from subsequent MOS device processing.

6. The method of claim 1, wherein the strained semiconductor layer is undoped.

7. The method of claim 1, wherein the strained semiconductor layer has a thickness on the order of 100 to 300 angstroms.

8. The method of claim 1, wherein the strained semiconductor layer includes at least one selected from the group consisting of a SiC strained layer and a SiGe strained layer.

9. The method of claim 8, wherein the SiC strained layer comprises tensile strained SiC for an n-type MOS device.

10. The method of claim 9, further wherein the SiC strained layer comprises on the order of one-tenth to two atomic percent (0.1 to 2 at. %) carbon.

11. The method of claim 9, further wherein the n-type MOS device comprises an n-type LDMOS device.

12. The method of claim 8, wherein the SiGe strained layer comprises compressive strained SiGe for a p-type MOS device.

13. The method of claim 12, further wherein the p-type MOS device comprises a p-type LDMOS device.

14. The method of claim 12, further wherein the SiGe strained layer comprises on the order of ten to fifty atomic percent (10 to 50 at. %) germanium.

15. The method of claim 1, further comprising:
prior to forming the remainder of the MOS device, capping the strained semiconductor layer with a selectively grown semiconductor material.

16. The method of claim 15, wherein the selectively grown semiconductor material provides a consumable layer for consumption during the forming of at least one gate dielectric.

17. The method of claim 16, further wherein the selectively grown semiconductor material comprises epitaxial silicon.

18. The method of claim 16, wherein the selectively grown semiconductor material has a thickness on the order of 50 to 150 angstroms.

19. A method of forming a metal oxide semiconductor (MOS) device comprising:

defining an active area in an unstrained semiconductor layer structure, the active area including at least a first doped region of a first conductivity type and a second doped region of a second conductivity type;

depositing a hard mask overlying the active area and a region outside of the active area;

patterning the hard mask to expose the active area;

selectively growing a strained semiconductor layer overlying the exposed active area, the strained semiconductor layer thereby providing a biaxially strained channel for the MOS device, wherein the strained semiconductor layer includes at least one selected from the group consisting of a SiC strained layer and a SiGe strained layer, further wherein the SiC strained layer comprises on the order of one-tenth to two atomic percent (0.1 to 2 at. %) carbon, further wherein the SiGe strained layer comprises on the order of ten to fifty atomic percent (10 to 50 at. %) germanium;

capping the strained semiconductor layer with a selectively grown semiconductor material; and forming a remainder of the MOS device including forming at least a gate dielectric, gate electrodes, source and drain implants, and sidewall spacers, wherein during a portion of forming the remainder of the MOS device, dopant of the first conductivity type of the first doped region of the active area and dopant of the second conductivity type of the second doped region of the active area diffuses into overlying portions of the strained semiconductor layer to create a correspondingly doped strained semiconductor layer, the correspondingly doped strained semiconductor layer thereby providing corresponding doping for the biaxially strained channel of the MOS device.

* * * * *